United States Patent
Kuo et al.

(10) Patent No.: US 7,508,277 B2
(45) Date of Patent: Mar. 24, 2009

(54) PHASE-LOCKED LOOP WITH VCO TUNING SENSITIVITY COMPENSATION

(75) Inventors: Chang-Fu Kuo, Hsin-Chu (TW); Po-Sen Tseng, Hsin-Chu (TW); Shou-Tsung Wang, Hsin-Chu (TW); Ling-Wei Ko, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 119 days.

(21) Appl. No.: 11/079,220

(22) Filed: Mar. 15, 2005

(65) Prior Publication Data
US 2006/0208804 A1 Sep. 21, 2006

(30) Foreign Application Priority Data
Mar. 17, 2004 (TW) .............................. 93107184 A

(51) Int. Cl.
*H03L 7/085* (2006.01)
(52) U.S. Cl. .................... 331/25; 455/260; 327/156
(58) Field of Classification Search .............. 331/25, 331/183, 16; 327/157, 156; 455/260
See application file for complete search history.

(56) References Cited

U.S. PATENT DOCUMENTS

| | | | | |
|---|---|---|---|---|
| 4,039,968 A * | 8/1977 | Emshwiller | ............... | 331/19 |
| 5,036,291 A * | 7/1991 | Marz | ............... | 329/325 |
| 5,973,572 A * | 10/1999 | Ukita | ............... | 331/25 |
| 6,366,620 B1* | 4/2002 | Jackson et al. | ............... | 375/308 |
| 6,667,663 B2* | 12/2003 | Ozawa | ............... | 331/17 |
| 6,885,873 B2* | 4/2005 | Ravi et al. | ............... | 455/517 |
| 2002/0039050 A1 | 4/2002 | Griffith et al. | | |
| 2004/0109521 A1* | 6/2004 | Jeong et al. | ............... | 375/376 |
| 2005/0073369 A1* | 4/2005 | Balboni et al. | ............... | 331/16 |

* cited by examiner

*Primary Examiner*—Robert Pascal
*Assistant Examiner*—James E Goodley
(74) *Attorney, Agent, or Firm*—Patterson & Sheridan, LLP

(57) ABSTRACT

The invention provides a phase-locked loop (PLL). Since a loop bandwidth of the PLL is a function of a gain of a phase detector and a gain of a voltage controlled oscillator (VCO), by adjusting the gain of the phase detector, the variation of the gain of the VCO (i.e., the tuning sensitivity) is compensated, so that the loop bandwidth of the PLL becomes more stable.

10 Claims, 12 Drawing Sheets

PHASE-LOCKED LOOP WITH VCO TUNING SENSITIVITY COMPENSATION

BACKGROUND OF THE INVENTION

This present invention relates to a phase-locked loop (PLL); more particularly, the present invention relates to a PLL capable of compensating the VCO tuning sensitivity by adjusting the phase detector gain according to the VCO tuning sensitivity so as to minimize the variation of the loop bandwidth of the PLL.

In communication systems, the phase-locked loop (PLL) is a device used for generating an output signal having a specific phase and a specific frequency. In order to achieve this goal, it is desired that the variation of the loop bandwidth (W) of the PLL could be minimized as much as possible.

Referring to FIG. 1, FIG. 1 is a system block diagram of a conventional PLL 10. The conventional PLL 10 comprises a phase detector 12, a loop filter 14, a voltage controlled oscillator (VCO) 16, and a frequency converter 18. The phase detector 12 is used for receiving an input signal ($F_I$) and a reference signal ($F_R$) and for comparing the phases of the input signal ($F_I$) and a reference signal ($F_R$), so as to obtain a phase difference signal ($S_P$) representing the phase difference ($\Delta$) between these two input signals $F_I$ and $F_R$. Receiving and filtering the phase difference signal ($S_P$), the loop filter 14 outputs a frequency controlled signal ($V_t$) to the VCO 16. The VCO 16 generates an output signal ($f_{PLL}$) as the output of the PLL 10. The frequency converter 18 receives the output signal ($f_{PLL}$), down-converts the output signal ($f_{PLL}$), and generates the reference signal ($f_R$) that is thus fed to the phase detector 12. As is well known in the art, a loop bandwidth (W) of the PLL is proportional to the square root of the product of a VCO gain ($K_{VCO}$) and a phase detector gain ($K_{PD}$), wherein the VCO gain ($K_{VCO}$) represents a ratio of the variation of the output signal ($f_{PLL}$) to the variation of the frequency controlled signal ($V_t$), and the phase detector gain ($K_{PD}$) represents a ratio of the phase difference signal ($S_p$) to the phase difference ($\Delta$). The VCO gain ($K_{VCO}$) is also referred as the tuning sensitivity.

Referring to FIG. 2, FIG. 3, and FIG. 4, FIG. 2 is a graph showing the relationship between the VCO gain ($K_{VCO}$) and the frequency controlled signal ($V_t$); FIG. 3 is a graph showing the relationship between the phase detector gain ($K_{PD}$) and the frequency controlled signal ($V_t$); FIG. 4 is a graph showing the relationship between the loop bandwidth (W) and the frequency controlled signal ($V_t$). Traditional VCO 16 is well developed to achieve a good linearity of the VCO gain ($K_{VCO}$), which means the VCO gain ($K_{VCO}$) substantially remains at a specific value within the operating range of the frequency controlled signal ($V_t$). However, when the PLL system is integrated into an integrated circuit (IC), the linearity of the VCO gain ($K_{VCO}$) becomes a seriously challenging issue. As shown in FIG. 2, the VCO gain ($K_{VCO}$) will have substantially different value for different frequency controlled signal ($V_t$). Though the phase detector gain ($K_{PD}$) might have perfect linearity (as shown in FIG. 3), the corresponding loop bandwidth (W) will have a undesired variation due to the poor linearity of the VCO gain ($K_{VCO}$). As shown in FIG. 4, the variation of the loop bandwidth (W) within the operating range of the frequency controlled signal ($V_t$) becomes too large to be acceptable.

Referring to FIG. 5, FIG. 5 is a system block diagram of another conventional PLL 20, disclosed in U.S. Patent Publication NO. 2002/0039050A1. Conventional PLL 20 comprises a VCO 25, a frequency divider 29, a phase detector 22, a charge pump 23, a loop filter 24, and a gain controller 26. The VCO 25 is used for receiving a frequency controlled signal ($V_t$), and for generating an output signal ($F_{out}$) correspondingly. The frequency divider 29 is used for dividing the output signal ($F_{out}$) according to a selected divisor and for generating a first feedback signal ($F_{fb}$). The phase detector 22 is a digital phase detector for detecting the phase difference between a reference signal ($F_{ref}$) and the first feedback signal ($F_{fb}$) and for outputting a phase difference signal ($S_p$). The charge pump 23 is used for receiving the phase difference signal ($S_p$) and for generating a current signal ($I_{fc}$), wherein a charge pump gain ($K_C$) of the charge pump 23 can be adjusted by a gain controlled signal ($S_{gc}$). The loop filter 24 is used for filtering the current signal ($I_{fc}$) outputted from the charge pump 23 and for generating the frequency controlled signal ($V_t$). The frequency controlled signal ($V_t$) is further transmitted to a high impedance buffered amplifier/filter 27, and then a second feedback signal ($V_{fb}$) is obtained. The gain controller 26 is used for receiving the second feedback signal ($V_{fb}$). After the second feedback signal ($V_{fb}$) is converted from analog format to digital format via an analog/digital converter 28 comprised in the gain controller 26, the second feedback signal ($V_{fb}$) in digital format is taken as an index for looking into a look-up table (not shown) built in the gain controller 26 to obtain the gain controlled signal ($S_{gc}$) for adjusting the charge pump gain ($K_C$).

As is well known in the art, the loop bandwidth (W) is proportional to the square root of the product of the VCO gain ($K_{VCO}$) and the charge pump gain ($K_c$), the conventional PLL 20 minimize the variation of the loop bandwidth (W) by adjusting the charge pump gain ($K_c$). However, conventional PLL 20 disclosed in U.S. Patent Publication NO. 2002/0039050A1 can only be applied for the situation when the phase detector in the PLL is a digital one, which would have an associated charge pump, rather than an analog one, which would not have a charge pump. Therefore, it is still a problem how to compensate the loop bandwidth of a PLL having an analog phase detector in an IC.

SUMMARY OF THE INVENTION

The main objective of the present invention is to provide a phase-locked loop (PLL) capable of compensating the VCO tuning sensitivity so as to minimize the variation of the loop bandwidth of the PLL.

The present invention is a PLL, which comprises a phase detector, a loop filter, a gain controller, and a voltage controlled oscillator (VCO). The phase detector is used for receiving a first feedback signal, a reference signal, and a gain controlled signal. The first feedback signal corresponds to an output signal outputted from the VCO. The phase detector outputs a phase difference signal in response to a phase difference between the first feedback signal and the reference signal. The gain controlled signal relates to the adjustment of the phase detector gain according to the a second feedback signal.

The loop filter is used for filtering the phase difference signal to output a frequency controlled signal. The gain controller has an input coupled to receive the second feedback signal relative to the phase difference signal. The second feedback relates to the phase difference signal, and the gain controller also generates the gain controlled signal in response to the second feedback signal. The VCO has an input coupled to receive the frequency controlled signal; the VCO also outputs the output signal in response to the frequency controlled signal. The phase detector gain is adjusted in accordance with the second feedback signal, so as to compensate the variation of the VCO gain and to make the loop bandwidth stable.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 6:
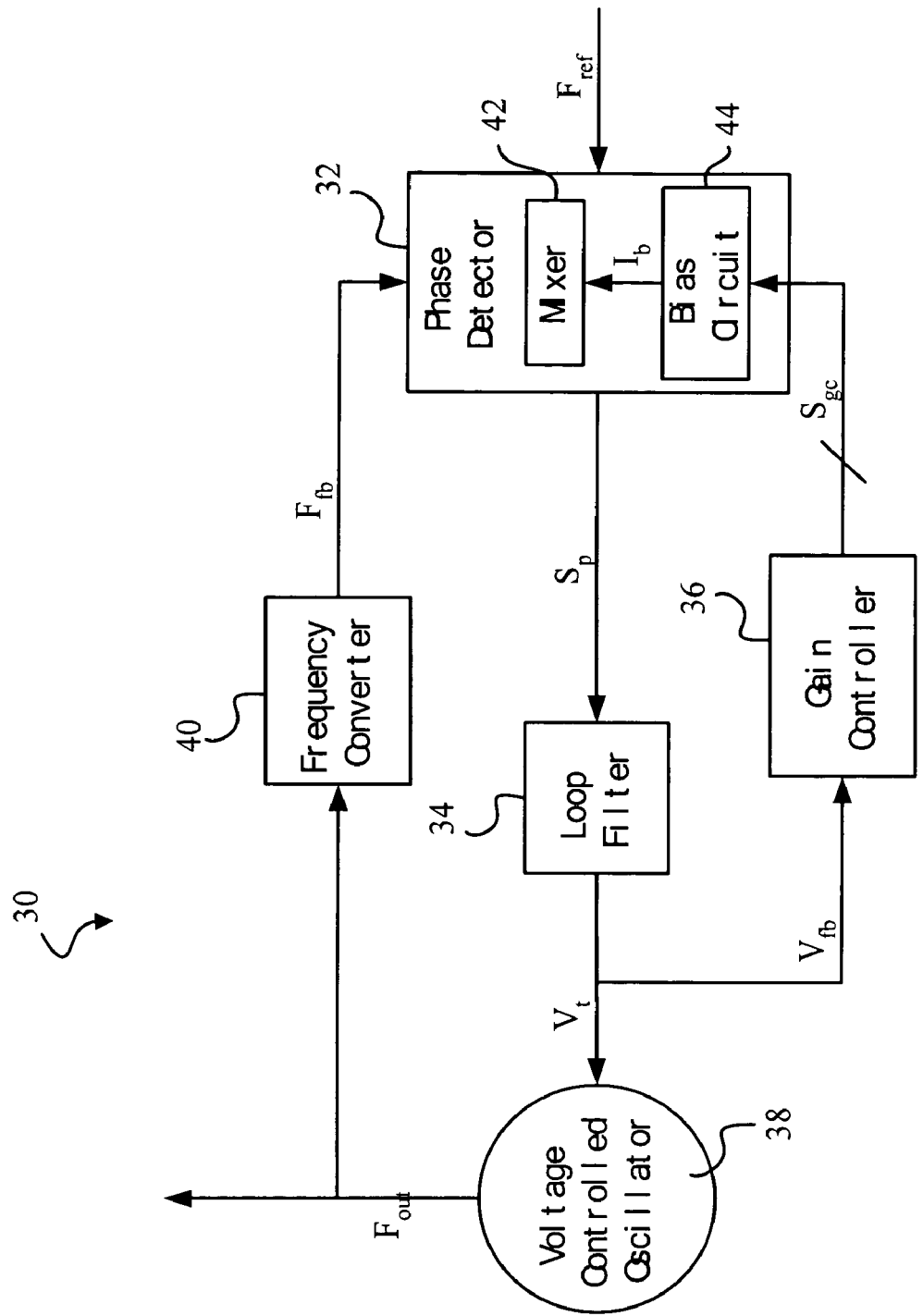
FIG. 6 is a system block diagram of the PLL according to an embodiment of the present invention.

Referring to FIG. 6, FIG. 6 is a system block diagram of the phase-locked loop (PLL) 30 according to an embodiment of the present invention. The present invention provides a PLL 30; the PLL 30 comprises a phase detector 32, a loop filter 34, a gain controller 36, a voltage controlled oscillator (VCO) 38, and a frequency converter 40.

The phase detector 32 is an analog phase detector; it is used for receiving a first feedback signal ($F_{fb}$), a reference signal ($F_{ref}$), and a gain controlled signal ($S_{gc}$) and for outputting a phase difference signal ($S_p$) in response to a phase difference ($\Delta$) between the first feedback signal ($F_{fb}$) and the reference signal ($F_{ref}$). A phase detector gain ($K_{PD}$) of the phase detector 32 is defined as a ratio of the phase difference signal ($S_p$) to the phase difference ($\Delta$). The phase detector gain ($K_{PD}$) of the phase detector 32 is adjustable based on the gain controlled signal ($S_{gc}$).

As an example, the phase detector 32 comprises a mixer 42 and a bias circuit 44. The phase detector gain ($K_{PD}$) of the phase detector 32 is affected by the bias current ($I_b$) outputted by the bias circuit 44. By utilizing this fact, the gain controlled signal ($S_{gc}$) according to the present invention is empoyed to control the bias circuit 44 to adjust the bias current ($I_b$) to affect the phase detector gain ($K_{PD}$) accordingly. The first feedback signal ($F_{fb}$) corresponds to the feedback of the output signal ($F_{out}$) outputted from the VCO 38. The loop filter 34 is used for filtering the phase difference signal ($S_p$) and outputting a frequency controlled signal ($V_t$).

The VCO 38 is used for receiving the frequency controlled signal ($V_t$) and generating the output signal ($F_{out}$) in response to the frequency controlled signal ($V_t$). The frequency converter 40 is used for receiving the output signal ($F_{out}$) and down-converting the output signal ($F_{out}$) to output the first feedback signal ($F_{fb}$). The frequency converter 40 can be a conventional frequency divider or a conventional mixer, or the like. The gain controller 36 is used for receiving a second feedback signal ($V_{fb}$), e.g., which is just the frequency controlled signal ($V_t$), and generating the gain controlled signal ($S_{gc}$) in response to the second feedback signal ($V_{fb}$).

Figure 7:
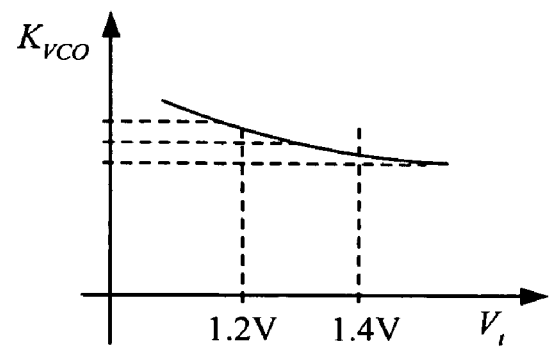
FIG. 7 is a graph showing the relationship between the VCO gain and the frequency controlled signal.

Referring to FIG. 7, FIG. 7 is a graph showing the relationship between the VCO gain ($K_{VCO}$) and the frequency controlled signal ($V_t$). Due to the characteristcs of the VCO component, the VCO gain ($K_{VCO}$) across the operating range of the frequency controlled signal ($V_t$) cannot be viewed as a substantially constant. According to the present invention, the operating range of the frequency controlled signal ($V_t$) is divided into several sub-ranges. An an example shown in FIG. 7, the operating range of the frequency controlled signal ($V_t$) is divided into three sub-ranges, which are "under 1.2V", "1.2V to 1.4V", and "above 1.4V". According to the present invention, a value is selected for representing the VCO gain ($K_{VCO}$) across respective sub-range of the frequency controlled signal ($V_t$). In FIG. 7, the values are selected as 14, 12, and 10 MHz/volt respectively. In this situation, in order to compensate the variation of the VCO gain ($K_{VCO}$) across these three sub-ranges of the frequency controlled signal ($V_t$), the desired phase detector gains ($K_{PD}$) would be $K_0/14$, $K_0/12$, and $K_0/10$ respectively for the three sub-ranges of the frequency controlled signal ($V_t$), where $K_0$ is a real number.

Figure 1:
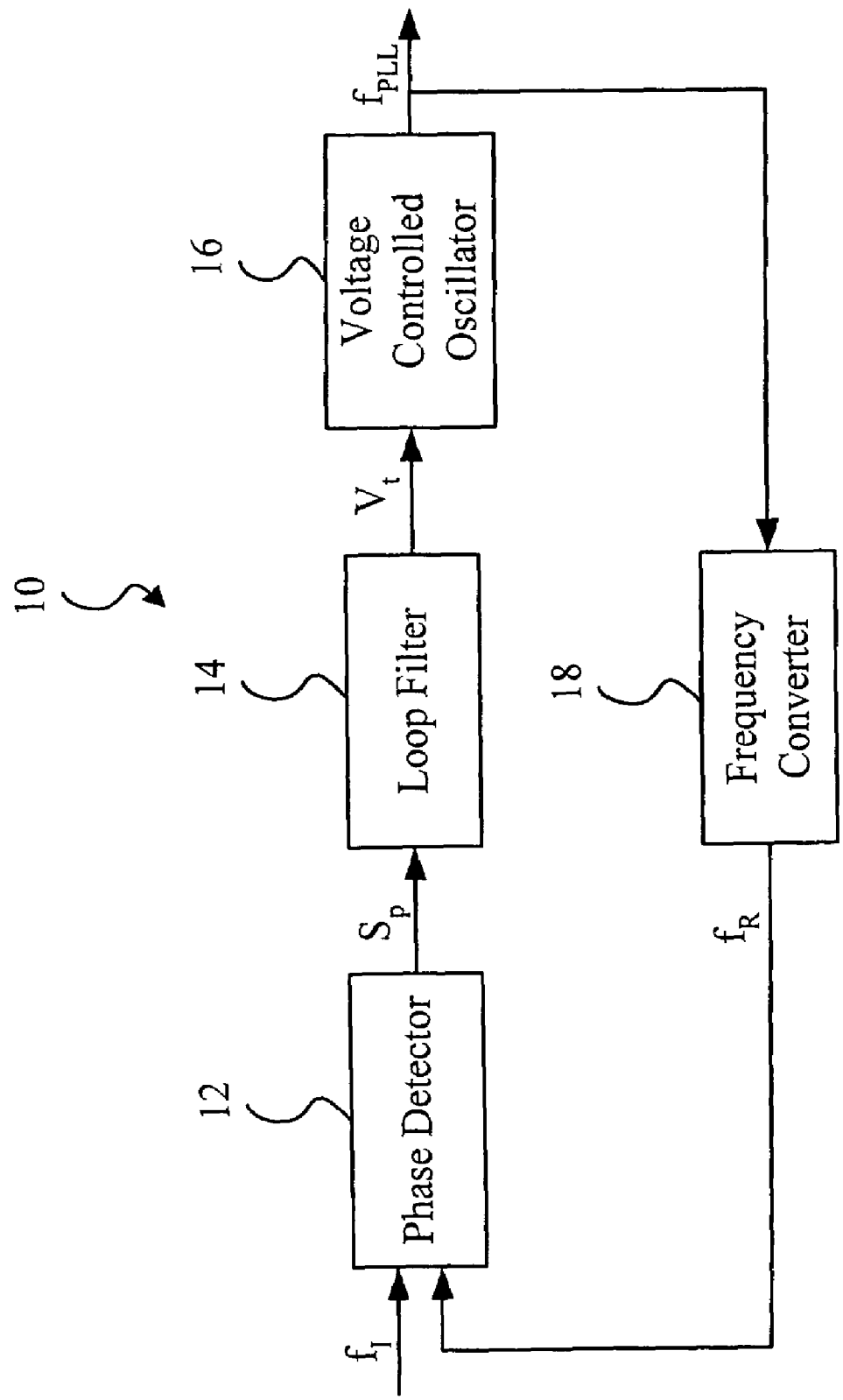
FIG. 1 is a system block diagram of a conventional PLL.
Figure 2:
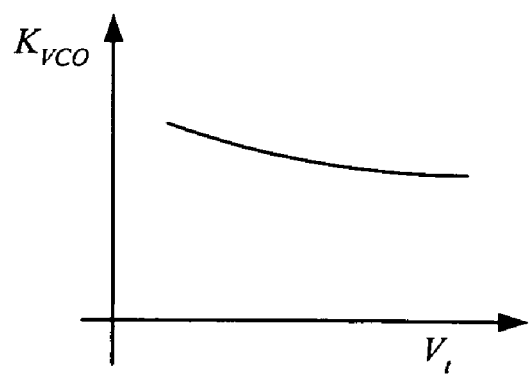
FIG. 2 is a graph showing the relationship between the VCO gain and the frequency controlled signal.
Figure 3:
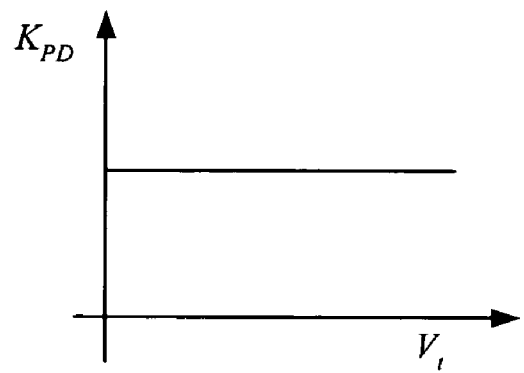
FIG. 3 is a graph showing the relationship between the phase detector gain and the frequency controlled signal.
Figure 4:
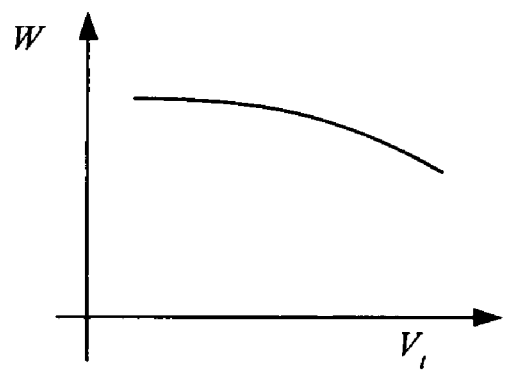
FIG. 4 is a graph showing the relationship between the loop bandwidth and the frequency controlled signal.
Figure 5:
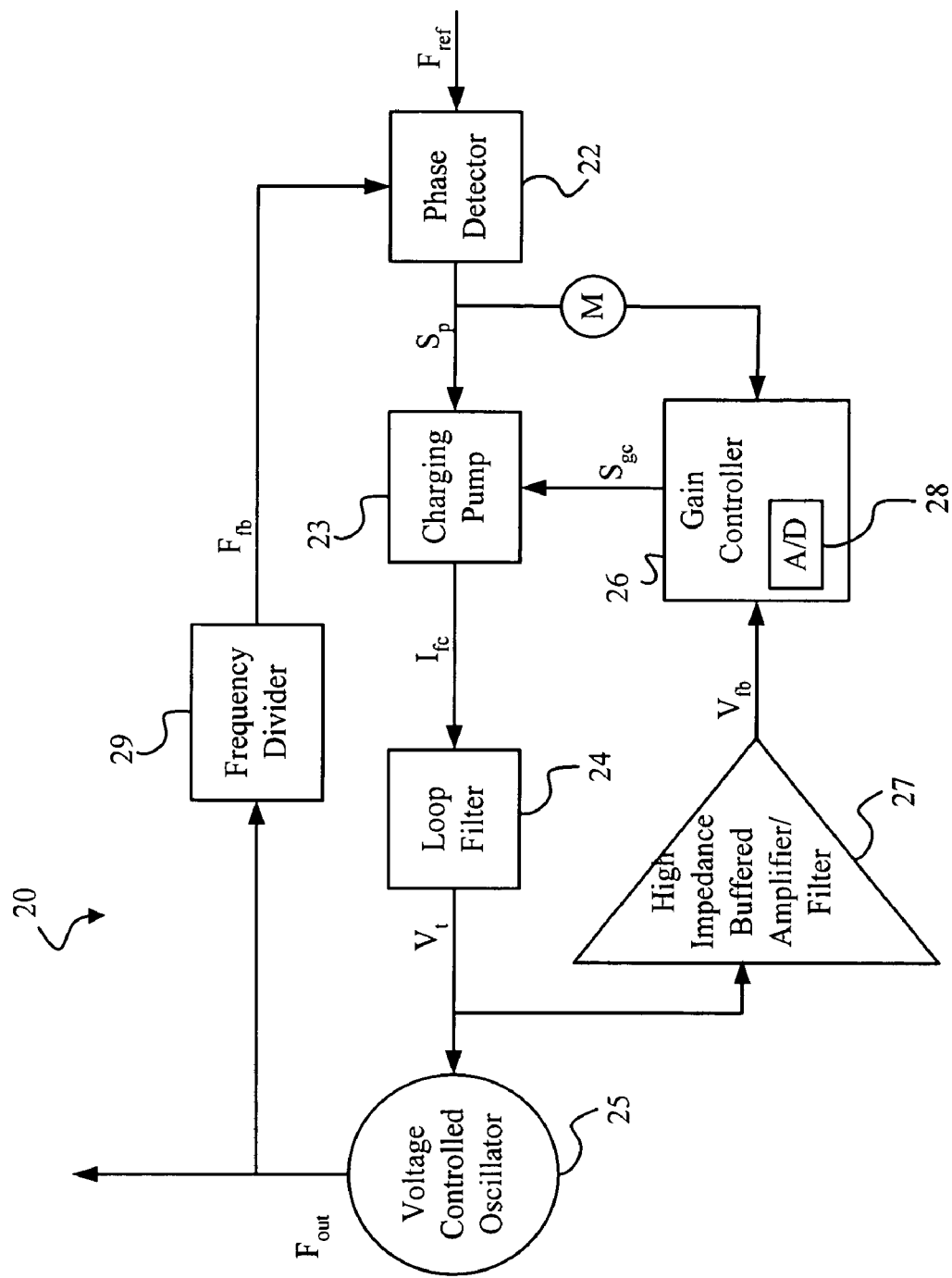
FIG. 5 is a system block diagram of another conventional PLL.
Figure 8:
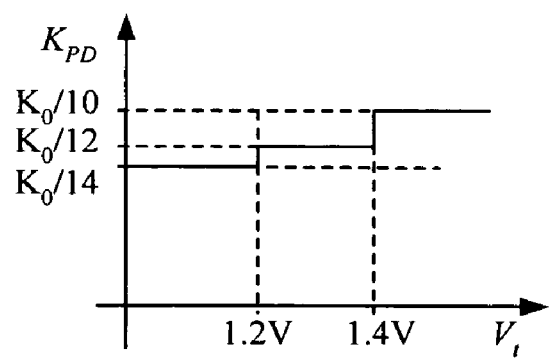
FIG. 8 is a graph showing the desired relationship between the phase detector gain and the frequency controlled signal according to the present invention.
Figure 9:
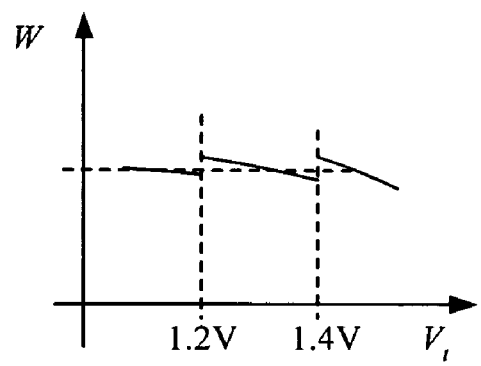
FIG. 9 is a graph showing the relationship between the loop bandwidth and the frequency controlled signal according to the present invention.

FIG. 8 is a graph showing the desired relationship between the phase detector gain ($K_{PD}$) and the frequency controlled signal ($V_t$) according to the present invention. Based on the VCO gain ($K_{VCO}$) shown in FIG. 7 and the phase detector gain ($K_{PD}$) shown in FIG. 8, the resultant curve of the loop bandwidth (W) versus the frequency controlled signal ($V_t$) can be derived and is shown in FIG. 9. As can be seen, by properly adapting the phase detector gain ($K_{PD}$) as shown in FIG. 8, the vairation of the loop bandwidth (W) can be reduced with respect to the conventional case shown in FIG. 4.

Three exemplar embodiments of the phase detectors whose phase detector gain ($K_{PD}$) can be adjusted according to the gain controlled signal are described as follows. However, the other phase detectors having adjustable phase detector gain ($K_{PD}$) are also within the scope and spirit of the present invention.

Figure 10A:
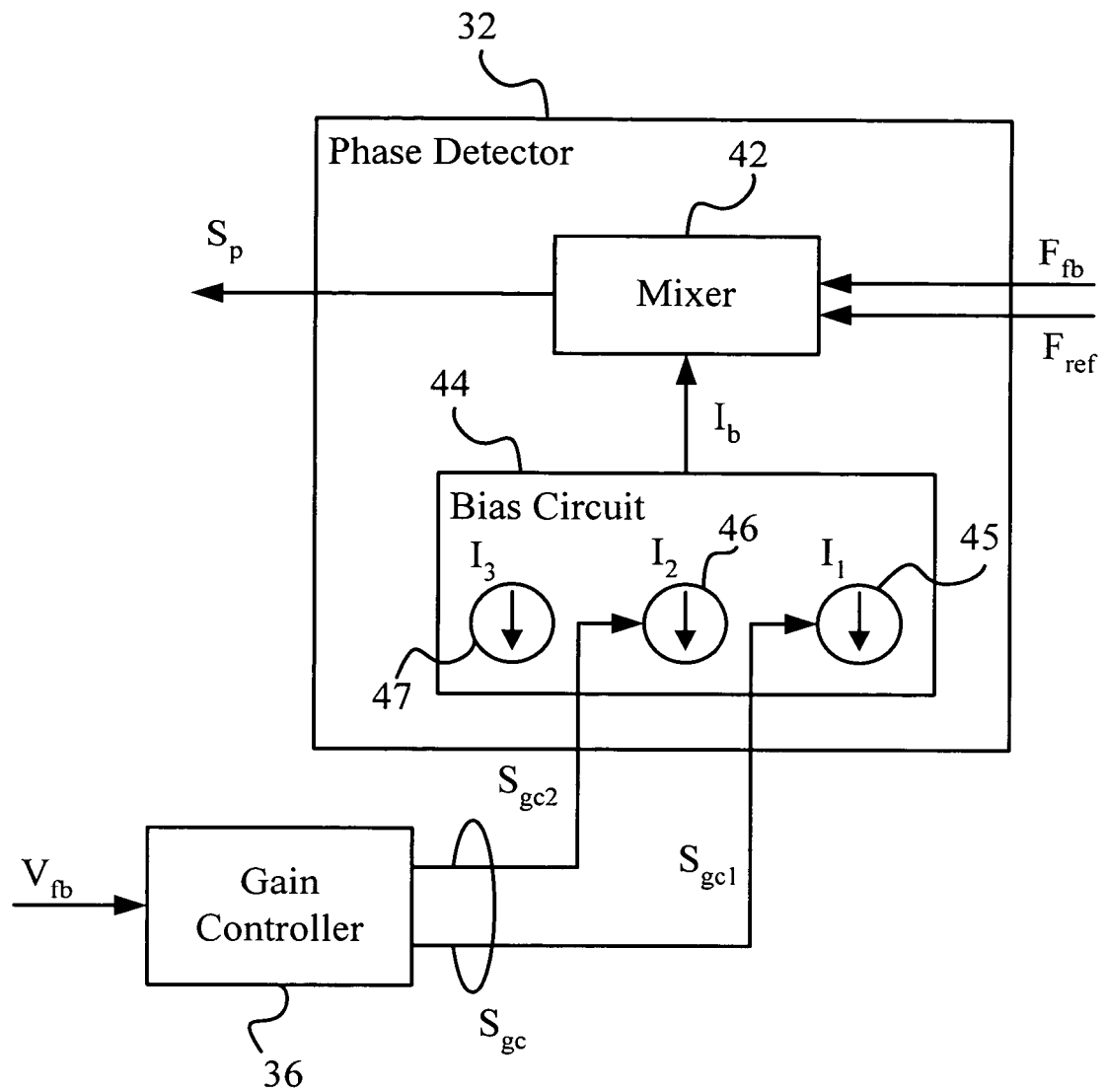
FIG. 10A is a schematic diagram of the phase detector and the gain controller in the PLL according to an enbodiment of the present invention.

Referring to FIG. 10A, FIG. 10A is a schematic diagram of the phase detector and the gain controller in the PLL according to an embodiment of the present invention, wherein the gain controlled signal ($S_{gc}$) controls the bias current ($I_b$) via a bias circuit 44 of the phase detector 32 so as to adjust the phase detector gain ($K_{PD}$) of the phase detector 32. As is known in the art, the phase detector gain ($K_{PD}$) is typically proportional to the bias current ($I_b$). Thus, the bias current ($I_b$), which could result in the phase detector gain ($K_{PD}$) shown in FIG. 8, would be the one shown in FIG. 11A. The values of the bias current ($I_b$) should be 30·$I_0$, 35·$I_0$, and 42·$I_0$ for the individual sub-range of the second feedback signal ($V_{fb}$), respectively, wherein $I_0$ is a real number. As shown in FIG. 10A, the gain controlled signal ($S_{gc}$) comprises two switch controlled signals, which are a first switch controlled signal ($S_{gc1}$) and a second switch controlled signal ($S_{gc2}$). The bias circuit 44 comprises three current sources, which are a first current source 45, a second current source 46, and a third current source 47. The first switch controlled signal ($S_{gc1}$) is used to determine whether the first current source 45 provides a first current ($I_1$) to the mixer 42 or not; the second switch controlled signal ($S_{gc2}$) is used to determine whether the second current source 46 provides a second current ($I_2$) to the mixer 42 or not. The third current source 47 always provides a third current ($I_3$) to the mixer 42. That is, the bias current ($I_b$) is a value obtained by selectively adding the first current ($I_1$) as well as selectively adding the second current ($I_2$) to the third current ($I_3$).

Figure 11A:
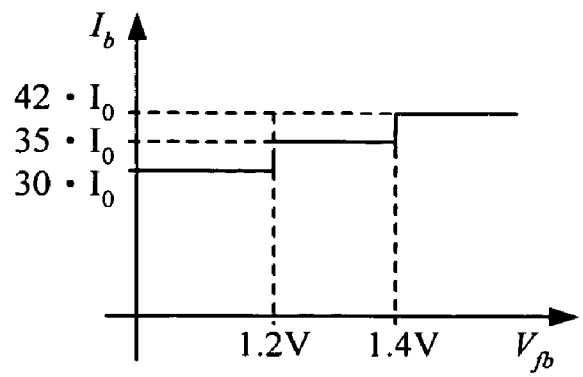
FIG. 11A is a graph showing the relationship between the bias current and the second feedback signal according to the present invention.

To comply with FIG. 11A, the first current $I_1$, the second current $I_2$, the third current $I_3$ can be 5·$I_0$, 7·$I_0$, and 3·$I_0$, respectively. Referring to FIG. 11A, when the second feedback signal ($V_{fb}$) is smaller than 1.2V, the first switch controlled signal ($S_{gc1}$) and the second switch controlled signal ($S_{gc2}$) of the gain controlled signal ($S_{gc}$) respectively turn off the first current $I_1$ and the second current $I_2$ in the mixer 42; thus, in this case, the bias current ($I_b$) is 30·$I_0$. When the second feedback signal ($V_{fb}$) is larger or equal to 1.2V and smaller than 1.4V, the first switch controlled signal ($S_{gc1}$) turns on the first current $I_1$ in the mixer 42, and the second switch controlled signal ($S_{gc2}$) turn off the second current $I_2$ in the mixer 42; thus, in this case, the bias current ($I_b$) is 35·$I_0$. When the second feedback signal ($V_{fb}$) is larger or equal to 1.4V, the first switch controlled signal ($S_{gc1}$) and the second switch controlled signal ($S_{gc2}$) respectively turn on the first current $I_1$ and the second current $I_2$ in the mixer 42; thus, in such a case, the bias current ($I_b$) is 42·$I_0$. By this way, the desired result shown in FIG. 11A is achieved.

Figure 10B:
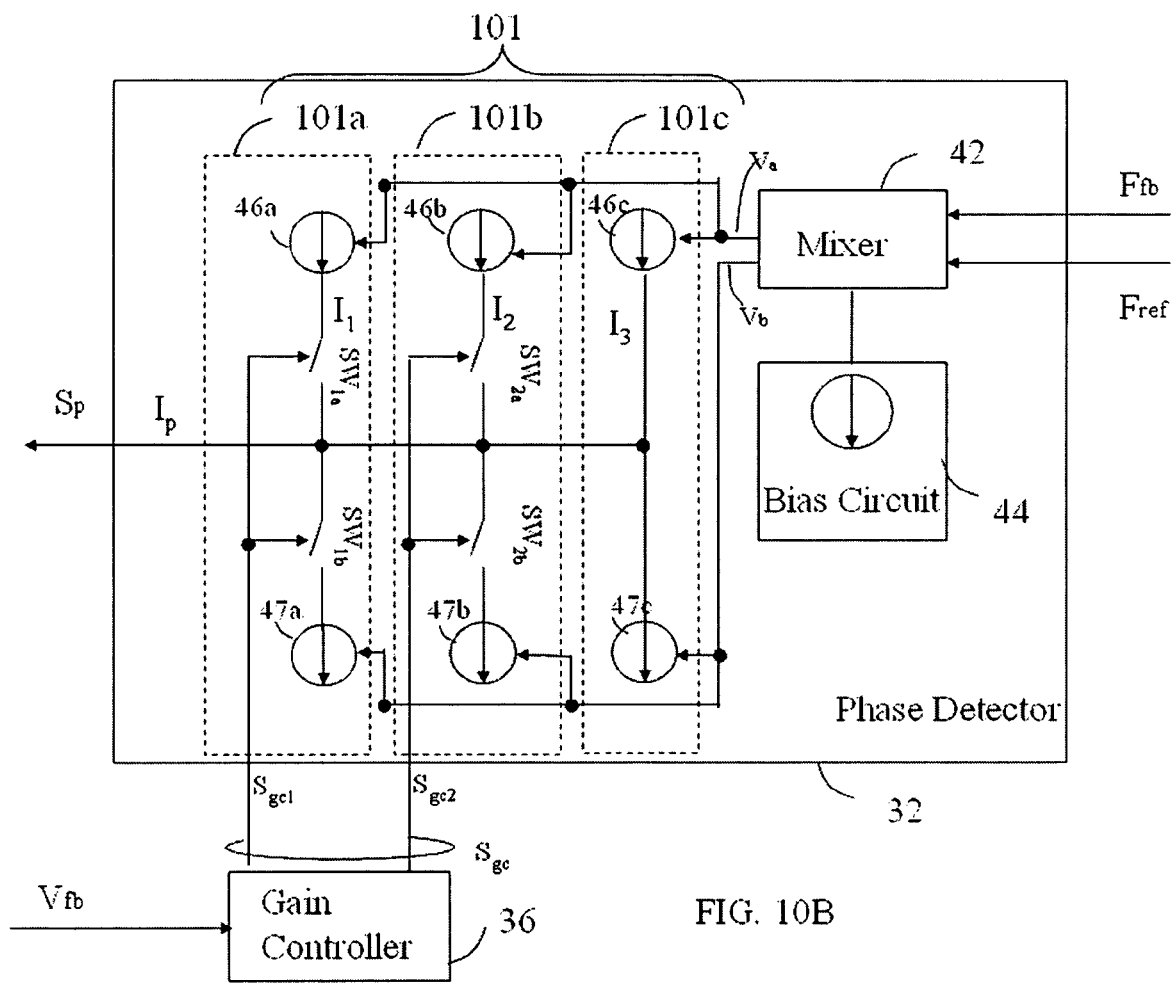
FIG. 10B is a schematic diagram of the phase detector and the gain controller in the PLL according to another enbodiment of the present invention.

Referring to FIG. 10B, FIG. 10B is a schematic diagram of the phase detector and the gain controller in the PLL according to another embodiment of the present invention, in which the gain controlled signal ($S_{gc}$) controls an output current ($I_p$) of an output current unit 101 of the phase detector to achieve the goal of adjusting the phase detector gain ($K_{PD}$). The mixer 42, which is biased by the bias circuit 44, generates a control voltage $V_a$; and $V_b$ in accordance with the phase difference between the first feedback signal ($F_{fb}$) and a reference signal ($F_{ref}$). The output current unit 101 comprises three charge pump modules, which are the first charge pump module 101a, the second charge pump module 101b, and the third charge pump module 101c. The charge pump module 101a comprises a source current unit 46a, a sink current unit 47a, and switches $SW_{1a}$ and $SW_{1b}$. The charge pump module 101b comprises a source current unit 46b, a sink current unit 47b, and switches $SW_{2a}$ and $SW_{2b}$. The charge pump module 101c comprises a source current unit 46c and a sink current unit 47c. The source current units 46a, 46b, and 46c are used to source current to the output of the phase detector 32 according to the control voltage $V_a$. The amounts of current generated by the source current units 46a, 46b, and 46c have a ratio of $I_1$:$I_2$:$I_3$. The sink current units 47a, 47b, and 47c are used to sink current from the output of the phase detector 32 according to the control voltage $V_b$. The amounts of current absorbed by the source current units 46a, 46b, and 46c also have a ratio of $I_1$:$I_2$:$I_3$.

As is known in the art, the phase detector gain ($K_{PD}$) is typically proportional to the output current ($I_p$). Thus, the output current ($I_p$), which could result in the phase detector gain ($K_{PD}$) shown in FIG. 8, would be like the one shown in FIG. 11B. The values of the output current ($I_p$) should be 30·$I_0$, 35·$I_0$, and 42·$I_0$ for the individual sub-range of the second feedback signal ($V_{fb}$), respectively (that means the ratio is 1/14:1/12:1/10), wherein $I_0$ is a realnumber. As shown in FIG. 10B, the gain controlled signal ($S_{gc}$) comprises two switch controlled signals, which are a first switch controlled signal ($S_{gc1}$) and a second switch controlled signal ($S_{gc2}$) respectively. The first switch controlled signal ($S_{gc1}$) is used to determine whether the current generated by the first charge pump module 101a will contribute to the output current ($I_p$) or not, by controlling the switches ($SW_{1a}$ and $SW_{1b}$); the second switch controlled signal ($S_{gc2}$) is used for controlling whether the current generated by the charge pump module 101b will contribute to the output current ($I_p$) or not, by controlling the switches ($SW_{2a}$ and $SW_{2b}$). The current generated by the charge pump module 101c always contributes the output current ($I_p$). According to the above description, the output current ($I_p$) is a value obtained by selectively adding the current generated by the charge pump modules 101a and 101b to the current generated by the charge pump module 101c.

Figure 11B:
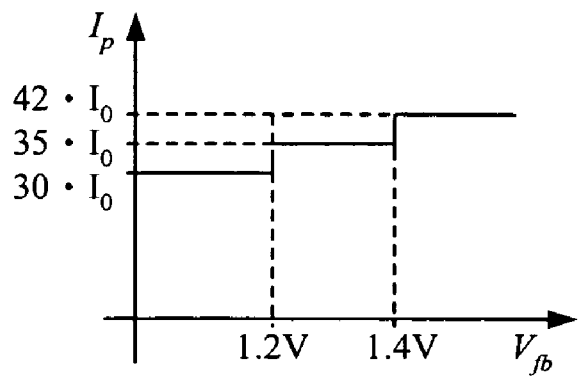
FIG. 11B is a graph showing the relationship between the output current of the phase detector and the second feedback signal according to the present invention.

Based on FIG. 11B, the value of $I_1$ is set as 5·$I_0$; the value of $I_2$ is set as 7·$I_0$, and the value of $I_3$ is set as 30·$I_0$, where $I_0$ is a real number. Referring to FIG. 11B, when the second feedback signal ($V_{fb}$) is smaller than 1.2V, the first switch controlled signal ($S_{gc1}$) and the second switch controlled signal ($S_{gc2}$) of the gain controlled signal ($S_{gc}$) respectively control to forbid the current output by the charge pump module 101a and charge pump module 101b from contributing to the output current ($I_p$); thus, in this case, the output current ($I_p$) is 30·$I_0$. When the second feedback signal ($V_{fb}$) is larger or equal to 1.2V and smaller than 1.4V, the first switch controlled signal ($S_{gc1}$) makes the current charge pump 101a to contribute current to the output current ($I_p$), and the second switch controlled signal ($S_{gc2}$) forbids the charge pump module 101b from contributing the current to the output current ($I_p$); thus, in such a case, the output current ($I_p$) is 35·$I_0$. When the second feedback signal ($V_{fb}$) is larger or equal to 1.4V, the first switch controlled signal ($S_{gc1}$) and the second switch controlled signal ($S_{gc2}$) respectively control the current generated by the charge pump module 101a and 101b to be added to the output current ($I_p$); thus, is this case, the output current ($I_p$) is 42·$I_0$. By this way, the result shown in FIG. 11B can be achieved.

Figure 10C:
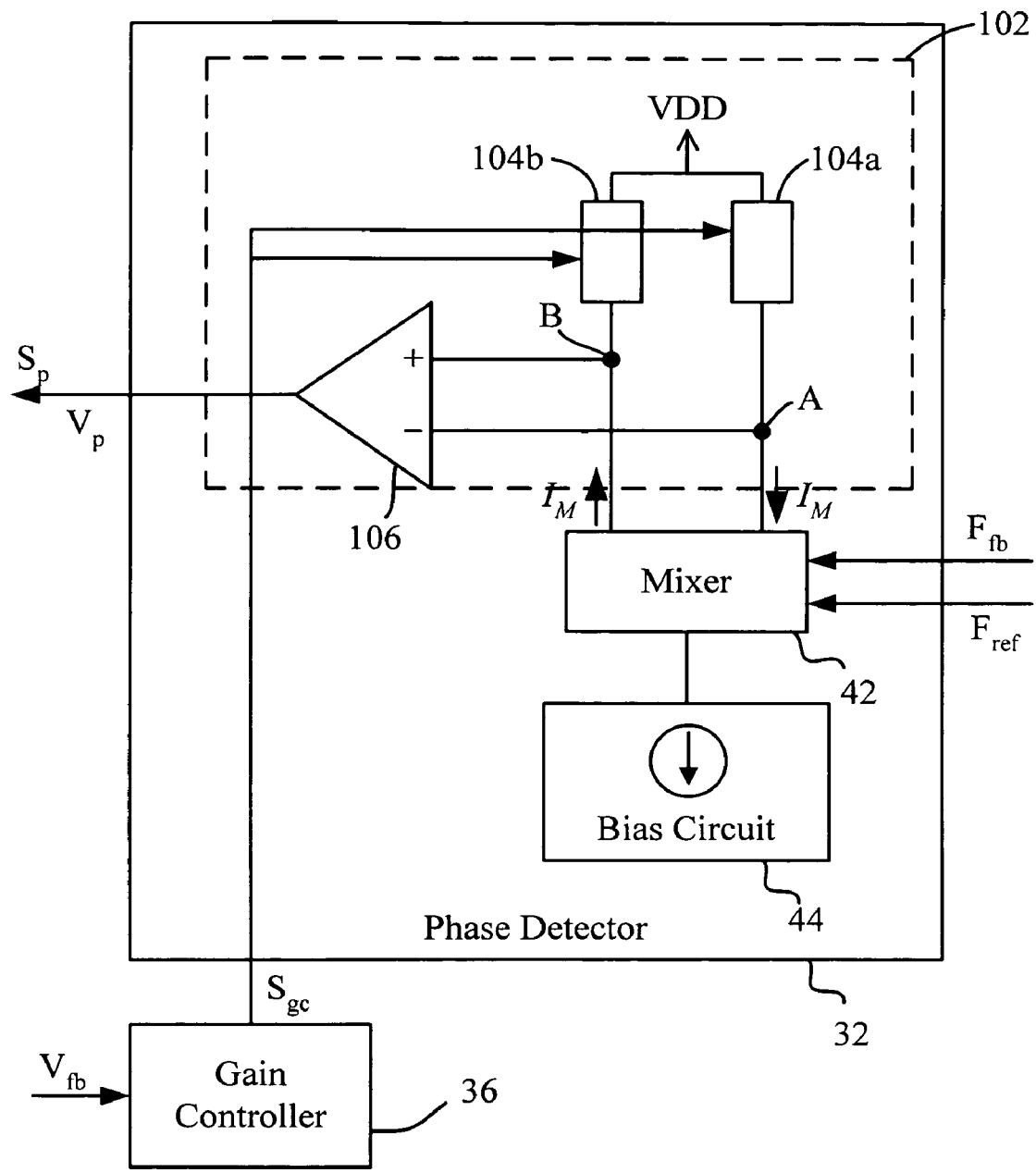
FIG. 10C is a schematic diagram of the phase detector and the gain controller in the PLL according to yet another enbodiment of the present invention.

Besides, the output signal of a phase detector can also be of voltage type. In such a case, as is known in the art, the phase detector gain ($K_{PD}$) is typically proportional to the output voltage ($V_p$). Referring to FIG. 10C, FIG. 10C is a schematic diagram of the phase detector and the gain controller according to yet another embodiment of the present invention, in which the gain controlled signal ($S_{gc}$) affects an output voltage ($V_p$) of an output voltage unit 102 of the phase detector 32 to achieve the objective of adjusting the phase detector gain ($K_{PD}$). The output voltage unit 102 comprises adjustable loadings (104a and 104b) and a subtractor (e.g. differential amplifier) 106. The output nodes (A and B) of the mixer 42 respectively connect to the supply voltage VDD via the adjustable loadings (104a and 104b), respectively. The adjustable loadings (104a and 104b) is controlled by the gain controlled signal ($S_{gc}$) to adjust the loading values. The node (A and B) further connect to a subtractor 106, so as to obtain a difference between the voltage ($V_A$) at the node (A) and the voltage ($V_B$) at the node (B) and to output the output voltage ($V_p$) as the output signal ($S_p$) of the phase detector 32. In other words, we have $V_p=V_B-V_A$. As an example, if the current flowing through the nodal (A) and the current flowing through the nodal (B) are both $I_M$ but with opposite directions, the output voltage ($V_p$) can be further obtained by, $V_p=V_B-V_A=I_M\times(Z_B+Z_A)$, wherein $Z_A$ and $Z_B$ are the impedances of the loadings (104a and 104b), respectively.

Figure 11C:
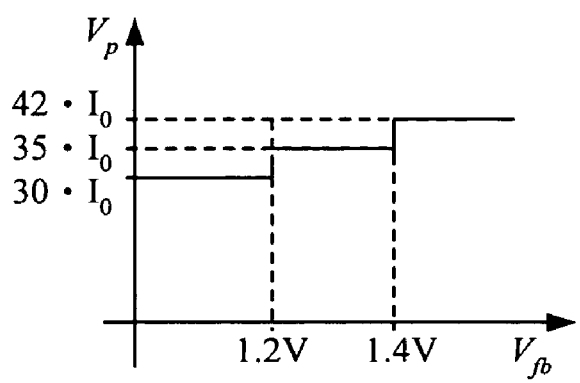
FIG. 11C is a graph showing the relationship between the output voltage of the phase detector and the second feedback signal according to the present invention.

Since the phase detector gain ($K_{PD}$) is typically proportional to the output voltage ($V_p$), if the phase detector gain ($K_{PD}$) is desired to be adjusted like the one shown in FIG. 8, the corresponding output voltage ($V_p$) would be the one shown in FIG. 11C. The values of the output voltage ($V_p$) should be $30\cdot V_0$, $35\cdot V_0$, and $42\cdot V_0$ for the sub-ranges of the second feedback signal ($V_{fb}$), respectively (that means the ratio is 1/14:1/12:1/10), wherein $V_0$ is a real number. Taking the above-mentioned condition as an example, the loading values ($Z_A$ and $Z_B$) of the loadings (104a and 104b) can be adjusted to have a value equal to 1, 35/30, or 42/30 times a basic value by the gain controlled signal ($S_{gc}$). This implies that the value ($Z_B+Z_A$) as well as the output voltage ($V_p$) can be adjusted to have a value equal to 1, 35/30, or 42/30 times another basic value. Therefore, the output voltage ($V_p$) is controlled as the result shown in FIG. 11C.

Figure 12:
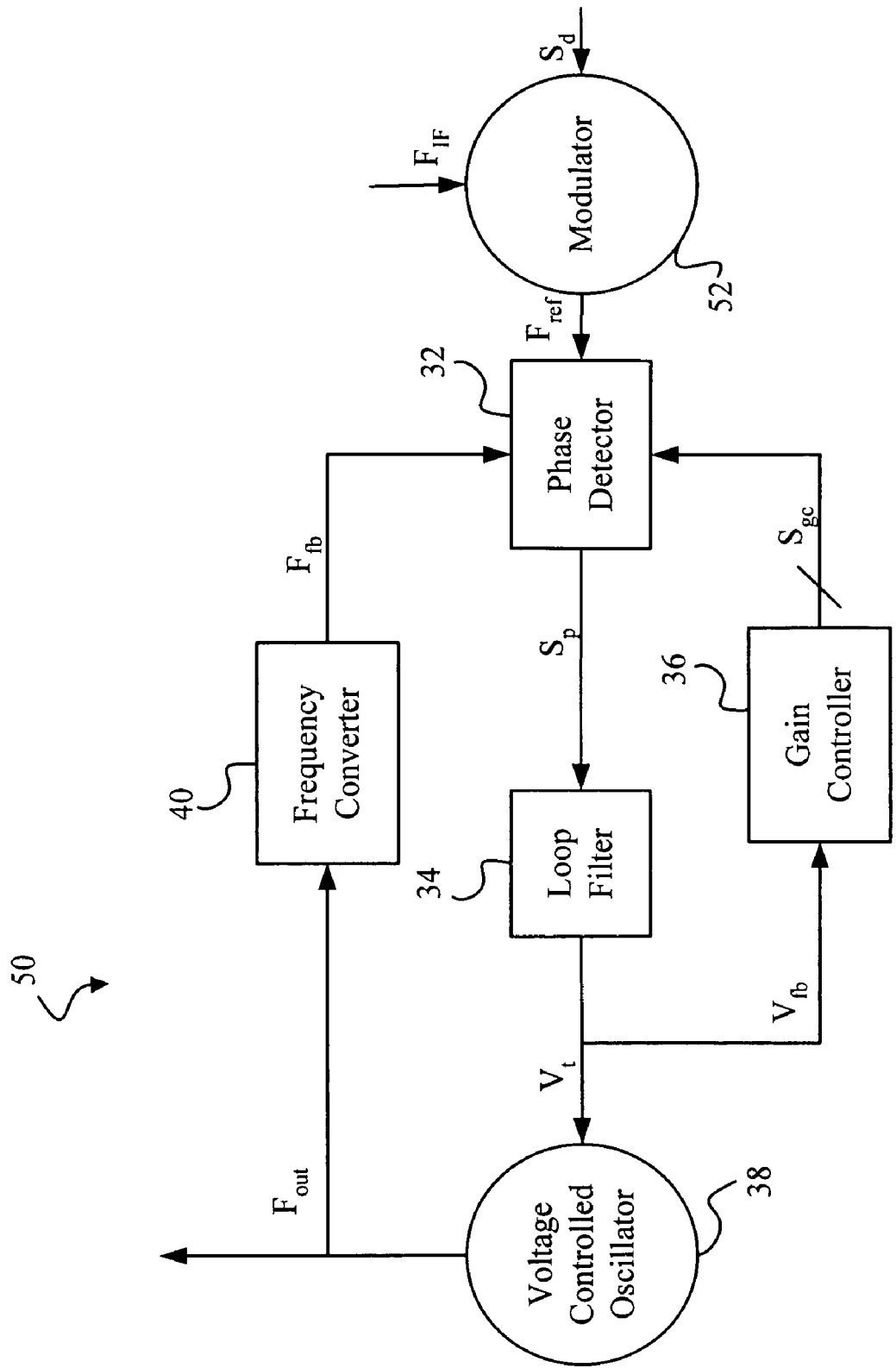
FIG. 12 is a system block diagram of the transmitter derived from the PLL according to the present invention.

As an exemplary application, the PLL 30 of the present invention shown in FIG. 6 can be applied to form a transmitter. Referring to FIG. 12, FIG. 12 is a system block diagram of the transmitter 50 derived from the PLL of the present invention by adding one more block, a modulator 52. The modulator 52 is used for receiving a data signal ($S_d$) and an intermediate-frequency signal ($F_{IF}$), and modulating the data signal ($S_d$) in accordance with the intermediate-frequency signal ($F_{IF}$) to output the reference signal ($F_{ref}$), which is then fed to the phase detector 32. The functions of the other components in FIG. 12 are the same as those in the FIG. 6 and will not be described again.

Figure 13:
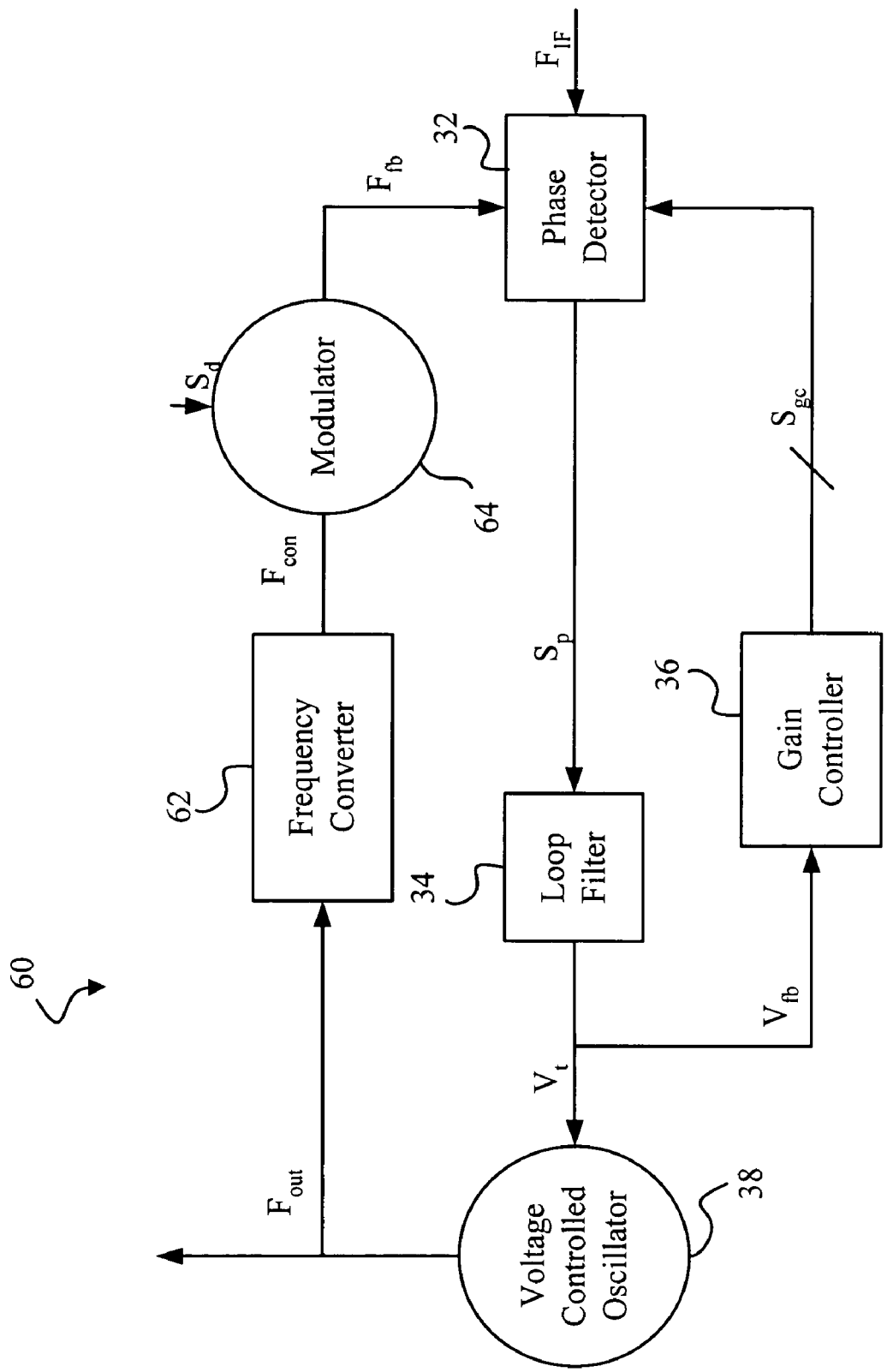
FIG. 13 is a system block diagram of the transmitter that is equivalent to the one shown in FIG. 12.

Referring to FIG. 13, FIG. 13 is a system block diagram of the transmitter 60 that is equivalent to, as well known in the art, the one shown in FIG. 12. A frequency converter 62 is used for receiving the output signal ($F_{out}$) outputted from the VCO 38 and for down-converting the output signal ($F_{out}$) to a down-converted signal ($F_{con}$). A modulator 64 is used for receiving a data signal ($S_d$) and the down-converted signal ($F_{con}$) and for modulating the data signal ($S_d$) in accordance with the down-converted signal ($F_{con}$) to output the first feedback signal ($F_{fb}$). The phase detector 32 is used for receiving the first feedback signal ($F_{fb}$) and an intermediate-frequency signal ($F_{IF}$) and for generating a phase difference signal ($S_p$). The functions of the other components are the same as those shown in the FIG. 6 and will not be described again.

Figure 14:
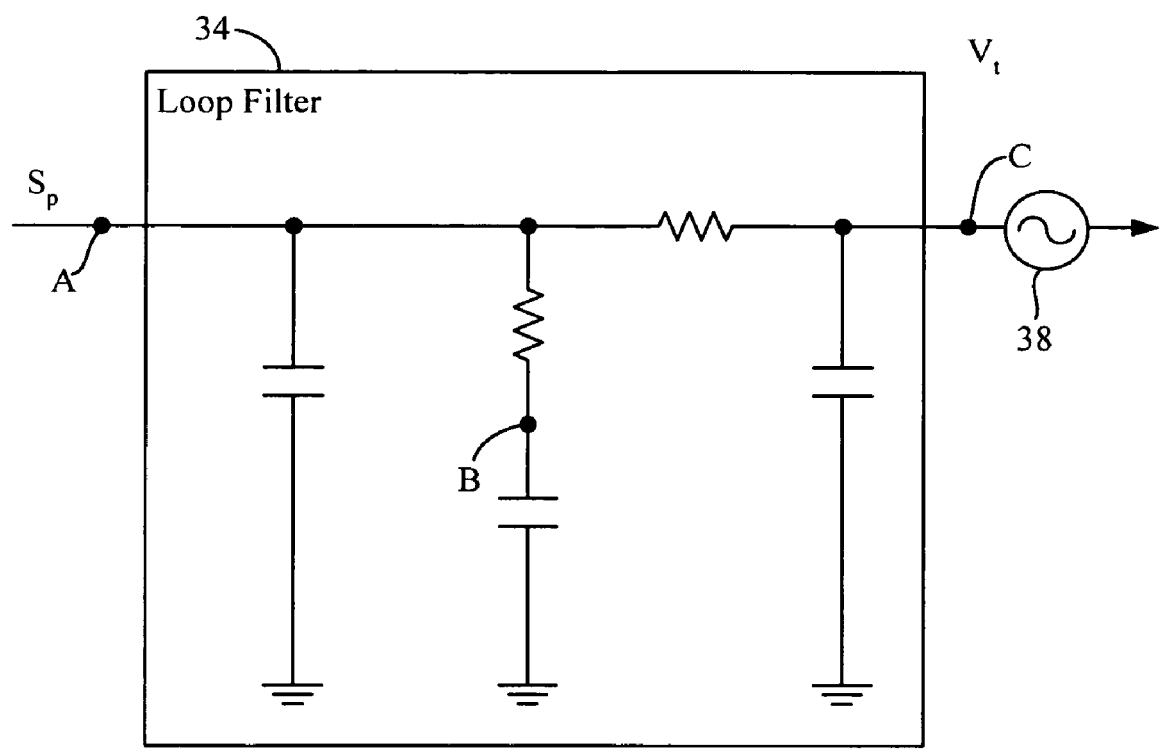
FIG. 14 is a circuit diagram of the second feedback signal point and the loop filter according to the present invention.

Referring to FIG. 14, FIG. 14 is a circuit diagram of the second feedback signal point and the loop filter 34 according to the present invention. In the FIG. 6, 10A, 10B, 10C, 12 and 13, the frequency controlled signal ($V_t$) is used as the second feedback signal ($V_{fb}$). According to the present invention, the second feedback signal ($V_{fb}$) can be obtained based on the phase difference signal ($S_p$) or an intermediate signal during the filtering of the phase difference signal ($S_p$) into the frequency controlled signal ($V_t$); that means, it is a signal during the filtering of the loop filter 34. As shown in FIG. 14, the second feedback signal ($V_{fb}$) can be fed back from a first signal point (A) (in this case, the second feedback signal ($V_{fb}$) is the phase difference signal ($S_p$)), from a second signal point (B) (in this case, the second feedback signal ($V_{fb}$) is a signal during the filtering of the loop filter 34), or from a third signal point (C) (in this case, the second feedback signal ($V_{fb}$) is the frequency controlled signal ($V_t$)).

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A phase-locked loop (PLL) capable of compensating a voltage controlled oscillator gain, said phase-locked loop comprising:
   a phase detector comprising:
      a mixer for receiving a reference signal and a first feedback signal corresponding to an output signal outputted from a voltage controlled oscillator (VCO), and outputting a phase difference signal in response to a phase difference between the first feedback signal and the reference signal, the mixer being biased by a bias current; and
      a bias circuit for outputting the bias current in response to receiving a gain controlled signal and thereby affecting a phase detector gain of the phase detector;
   a loop filter for filtering the phase difference signal to output a frequency controlled signal;
   a gain controller having an input coupled to receive a second feedback signal corresponding to the phase difference signal, and generating the gain controlled signal in accordance with the second feedback signal; and
   the VCO having an input coupled to receive the frequency controlled signal, the VCO also outputting the output signal in response to the frequency controlled signal;
   wherein the phase detector gain is adjusted in accordance with the second feedback signal.

2. The PLL of claim 1, wherein the gain controlled signal comprises a set of sub control signals, the bias circuit comprises at least one set of current sources, and each of the current sources is respectively turned on/off by a corresponding sub control signal.

3. The PLL of claim 1, wherein the second feedback signal is the phase difference signal, the frequency controlled signal, or an intermediate signal during the filtering of the phase difference signal into the frequency controlled signal.

4. The PLL of claim 1, further comprising:
   a frequency converter for receiving the output signal outputted from the VCO, and down-converting the output signal to output the first feedback signal; and
   a modulator for receiving a data signal and an intermediate-frequency signal, and modulating the data signal in accordance with the intermediate-frequency signal to output the reference signal.

5. The PLL of claim 1, further comprising:
   a frequency converter for receiving the output signal outputted from the VCO, and down-converting the output signal to output a down-converted signal; and
   a modulator for receiving a data signal and the down-converted signal, and modulating the data signal in accordance with the down-converted signal to output the first feedback signal.

6. A phase-locked loop (PLL) capable of compensating a voltage controlled oscillator gain, said phase-locked loop comprising:
   a phase detector comprising:
      a mixer for receiving a reference signal and a first feedback signal corresponding to an output signal outputted from a voltage controlled oscillator (VCO), and outputting a set of control currents in response to a phase difference between the first feedback signal and the reference signal; and an output voltage unit, based on a gain controlled signal and the set of control currents from the mixer, the output voltage unit adjusting an output voltage of the phase detector and thereby affecting a phase detector gain of the phase detector;

a loop filter for filtering a phase difference signal corresponding to the output voltage of the phase detector and outputting a frequency controlled signal;

a gain controller having an input coupled to receive a second feedback signal corresponding to the phase difference signal, and generating the gain controlled signal in accordance with the second feedback signal; and the VCO having an input coupled to receive the frequency controlled signal, the VCO also outputting the output signal in response to the frequency controlled signal;

wherein the phase detector gain is adjusted in accordance with the second feedback signal.

7. The PLL of claim 6, wherein the gain controlled signal comprises a set of sub control signals, the output voltage unit comprises a set of adjustable loadings and a differential amplifier, each of the adjustable loadings is respectively controlled by a corresponding sub control signal, each of the control currents outputted from the mixer flows through a corresponding adjustable loading and thereby generates an intermediate voltage, the differential amplifier receives the intermediate voltages and accordingly adjusts the output voltage of the phase detector.

8. The PLL of claim 6, wherein the second feedback signal is the phase difference signal, the frequency controlled signal, or an intermediate signal during the filtering of the phase difference signal into the frequency controlled signal.

9. The PLL of claim 6, further comprising:
a frequency converter for receiving the output signal outputted from the VCO, and down-converting the output signal to output the first feedback signal; and
a modulator for receiving a data signal and an intermediate-frequency signal and modulating the data signal in accordance with the intermediate-frequency signal to output the reference signal.

10. The PLL of claim 6, further comprising:
a frequency converter for receiving the output signal outputted from the VCO, and down-converting the output signal to output a down-converted signal; and
a modulator for receiving a data signal and the down-converted signal, and modulating the data signal in accordance with the down-converted signal to output the first feedback signal.

* * * * *